United States Patent [19]
Sriram et al.

[11] Patent Number: 6,096,637
[45] Date of Patent: Aug. 1, 2000

[54] ELECTROMIGRATION-RESISTANT VIA STRUCTURE

[75] Inventors: Tirunelveli S. Sriram, Maynard; Ann C. Westerheim, Westford; John J. Maziarz, Sutton; Vladimir Bolkhovsky, Framingham, all of Mass.

[73] Assignee: Compaq Computer Corporation, Houston, Tex.

[21] Appl. No.: 09/124,198

[22] Filed: Jul. 28, 1998

Related U.S. Application Data

[62] Division of application No. 08/806,276, Feb. 25, 1997, abandoned.

[51] Int. Cl.⁷ .................................................. H01L 21/4763
[52] U.S. Cl. ........................ 438/643; 438/688; 438/648; 438/685; 438/672; 438/675
[58] Field of Search ...................................... 438/643, 618, 438/622–624, 626, 627, 629, 631–633, 636–640, 648, 645, 672, 668, 675, 688

[56] References Cited

U.S. PATENT DOCUMENTS

| 5,202,579 | 4/1993 | Fujii et al. | 257/751 |
| 5,306,952 | 4/1994 | Matsuura et al. | 257/165 |
| 5,341,026 | 8/1994 | Harada et al. | 257/764 |

*Primary Examiner*—Charles Bowers
*Assistant Examiner*—Thanh Nguyen
*Attorney, Agent, or Firm*—Hamilton, Brook, Smith & Reynolds, P.C.

[57] ABSTRACT

A method is described for forming an electromigration-resistant (ER) intermetallic region beneath and adjacent a conductive plug in a via. Preferably the ER region is formed of a sintered intermetallic compound of Al and Ti, and the conductive plug is formed of W.

6 Claims, 1 Drawing Sheet

ELECTROMIGRATION-RESISTANT VIA STRUCTURE

RELATED APPLICATION(S)

This application is a Divisional Application of co-pending Application No. 08/806,276 filed on Feb. 25, 1997 now abandoned, the entire teachings of which are incorporated herein by reference.

BACKGROUND OF THE INVENTION

The present invention relates to an interconnection structure for semiconductor circuits, and more particularly to the interconnection of Very Large Scale Integrated (VLSI) semiconductor circuits having multilayer interconnection construction and which are connected through plugs formed in a connection hole, or "via."

Aluminum films and aluminum alloy films of low resistivity are widely used as the interconnection for semiconductor devices. The density of devices in modem VLSI circuits requires the use of multiple levels of interconnects separated by insulating material. Via holes in the insulating material are used to form plugs which connect these different levels. For dense patterns in the interconnect levels, it is important for the metal layer to be planar.

The planarity requirements require the use of high-aspect ratio vias to connect different interconnection levels. The high aspect ratio requires the vias to be filled with tungsten (W) deposited by chemical vapor deposition (CVD) to form a connection plug. The presence of these W plugs introduces a significant reliability risk due to electromigration when there is a repeated unidirectional current flow between metal levels through the W plug.

Electromigration is the current-assisted flow of atoms of the conductor. The rate of electromigration depends on the current density, ambient temperature, atomic weight of the elements constituting the conductor, the rate of diffusion and the hydrostatic stress present in the conductor. Failure of the circuit can occur when enough mass of the conductor has moved from a location to form a void leading to an open circuit or unacceptable increase in resistance. Alternatively, failure can also occur when conductor atoms collect at a particular site to form hillocks leading to short circuits between parallel conductors or over- or underlying interconnection levels.

In a VLSI circuit where repeated current flow in one direction between two levels of Al interconnections connected by a W plug can occur frequently, the interface between W plugs and Al interconnections are potential sites for electromigration failure. This is because tungsten does not electromigrate under conditions present during operation of the VLSI circuit due to its large atomic weight. Consequently, a flux divergence is introduced at the tungsten plug/Aluminum interface. This results in movement of Al atoms away from the plug when the electron flow direction is away from the plug. Voiding can therefore result at the plug-Aluminum interface, leading to open circuits.

This problem can be greatly exacerbated by the existence of poor mechanical adhesion between the base of the plug and underlying interconnect. Poor adhesion can result from the presence of etch residue from the via etch process. Poor mechanical adhesion is impossible to detect by conventional electrical testing due to inadequate sensitivity of the in-fab electrical test systems. However, in poorly adherent W plugs, very little Al removal is required to separate the W plug from the interconnect under unidirectional current flow. Therefore a very small void can lead to an unacceptably large increase in circuit resistance.

SUMMARY OF THE INVENTION

In accordance with the present invention, a method and apparatus are provided which greatly reduce the risk of electromigration by providing improved mechanical adhesion and electrical contact at the base of a connecting plug formed in a via. More particularly, in a preferred embodiment of the invention, a multilayer interconnection structure is formed on a substrate. The structure comprises a first underlayer formed on the insulating substrate, such as Ti upon which is formed a lower resistance interconnecting metallic line, typically of Al, followed by an anti-reflective (AR) coating metallic adhesion base line, or conductor, on the substrate, such as Ti, upon which is formed a lower interconnecting metallic line, typically of Al, followed by an anti-reflective (AR) coating typically consisting of a layer of Titanium (Ti) followed by a layer of titanium nitride (TiN).

Next, a dielectric insulating cross-over layer of, for example, $SiO_2$ is formed over the AR coating to insulate the underlying structure from an upper metallic interconnecting line which usually runs orthogonal to the lower metallic line. Before depositing the upper line, a via is formed by etching through the insulating layer down to the level of the underlying Al conductor. Next, a thin adhesion-promoting liner of Ti/TiN is formed over and onto the sides of the via hole and down to the level of the Al conductor. The structure thus formed is then subjected to a heat treatment which forms a compound intermetallic region below the via hole comprised of the Ti in the liner and the aluminum in the underlying metallic line. In addition, this heat treatment makes the TiN in the adhesion layer a more effective barrier to diffusion of fluorine and consequent chemical attack of the titanium in the liner during deposition of tungsten described below.

A tungsten (W) interconnect plug is then formed in the via by chemical vapor deposition of W using tungsten hexafluoride ($WF_6$) as the precursor and etched back until the top of the W plug is just below the top edge of the via. The tungsten plug is then capped by a second interconnect structure which comprises a second underlayer, such as Ti, upon which is formed a lower resistance interconnecting metallic line, typically of Al followed by an anti-reflective (AR) coating typically consisting of a layer of Titanium (Ti) followed by a layer of Titanium nitride (TiN). The compound intermetallic region formed at the interface between the tungsten interconnect and the underlying aluminum conductive line and the improved resistance of the TiN to diffusion of external species results in structures which have the longest median electromigration lifetime and the tightest distribution (SIGMA) of lifetimes under electromigration testing.

DETAILED DESCRIPTION OF THE INVENTION

Figure 1:
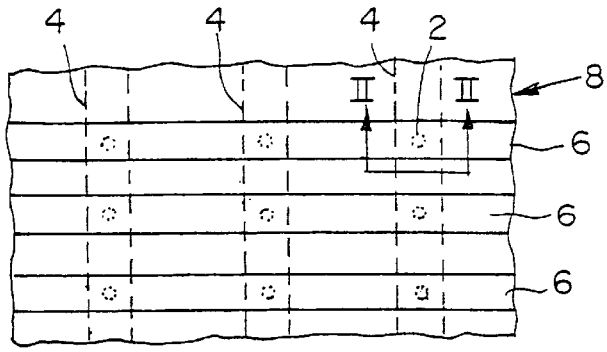
FIG. 1 is a plan view of an interconnect structure of the invention.

The invention will now be described in detail in connection with the drawings wherein FIG. 1 is a plan view of a portion of the VLSI semiconductor circuit 8 having a multilayer construction in which rows of conductors 6 on the top of a multilevel interconnection structure run above and orthogonal to columns of conductors 4 at the bottom layer. These conductive lines are interconnected by conductive plugs 2 formed through an intermediate insulating layer (not shown).

Figure 2A:
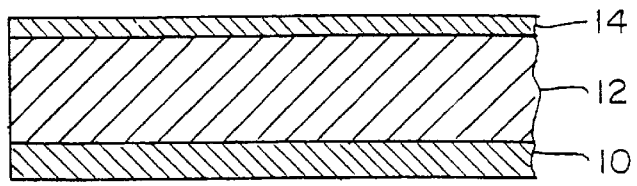
FIGS. 2A–2C are schematic cross-sectional views taken along lines II—II of FIG. 1 of the interconnect construction process in accordance with the invention.
Figure 2B:
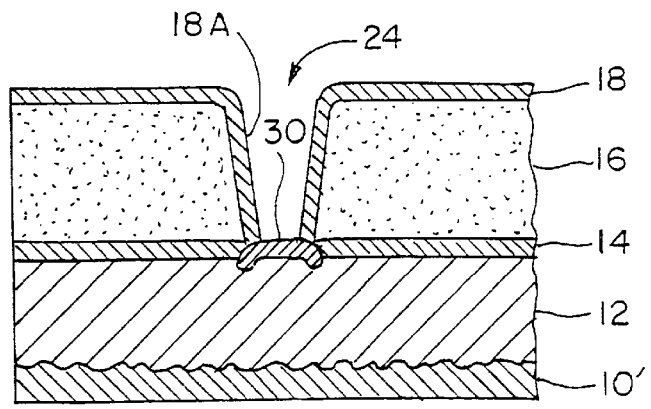
Figure 2C:
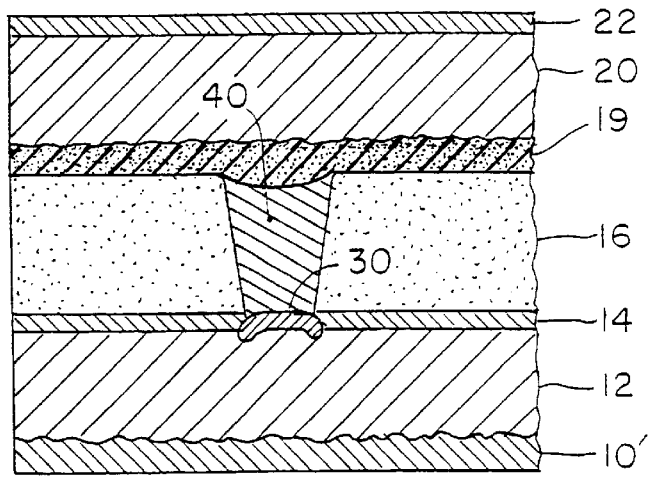

Turning to FIGS. 2A–2C, the process of forming the interconnection structure will be described. First, a thin base metallic underlayer 10 of, for example, Ti is formed, followed by a thick Al and 0.5% Cu layer 12 capped by a thin AR coating 14 of Ti/TiN. The foregoing layers are preferably formed by physical vapor deposition (PVD) and then formed into conductive lines by well-known photolithography and high density plasma etching using chlorine chemistry. Note that the deposited Aluminum 12 reacts with the underlying Ti line 10 providing an $Al_3Ti$ compound or alloy layer 10' indicated by the wavy line in FIG. 2B.

Next, an interlayer dielectric deposition is performed, preferably by a high density plasma deposition of $SiO_2$ to fill in gaps, followed by a conformal layer (not shown) of polyethyltetra-ethyloxysilane (PETEOS) based $SiO_2$. The upper surface of the interlayer dielectric 16 and conformal layer is then planarized by chemical-mechanical polishing (CMP) and a capping layer of oxide is formed thereover to achieve the desired target thickness for layer 16. Next, a hole 24 is formed through the dielectric layer 16, preferably by deep U.V. (248 nm) photolithography with bottom anti-reflective coating and etching to the approximate depth of the Ti/TiN AR layer 14. Preferably, a high density plasma process using $C_2F_6$ (fluorocarbon) chemistry is employed for etching the via 24. Care should be taken to remove any photoresist and polymer left in the via. Next, a thin 150Å Ti:/700Å TiN liner 18A of Ti/TiN is deposited over the $SiO_2$ 16 and into the via 24 using a collimated sputtering method. The structure of FIG. 2B is then heat treated for about 0.5 hours at about 410° C. in a nitrogen ambient to enable formation of an $Al_3Ti$ intermetallic region 30 formed by reaction, during the heat treatment, of the Ti in the AR liner 18A with the underlying Al in the line 12. In addition, this heat treatment makes the TiN in the liner more impervious to diffusion of foreign atomic species.

A tungsten plug 40 is then formed in the via (FIG. 2C) by a blanket deposition of tungsten using $WF_6$ chemistry with $SiH_4$ nucleation followed by etch back of the tungsten to leave behind the W plug 40 in the via (FIG. 2C). A thin adhesion layer of Ti is then deposited, followed by a thick layer 20 of Al 0.5% Cu, which reacts with the Ti layer to produce a compound layer 19 of $Al_3Ti$. Finally, a thin Ti/TiN capping layer 22 is formed on the Al layer 20. The layers are then patterned and etched by well-known photolithography and etching processes to complete the structure.

The $Al_3Ti$ region 30 does not electromigrate, therefore voiding beneath the plug is slower, and therefore resistance increases due to voiding occur more slowly, because a larger void volume is required to invoke sufficiently resistive alternative current paths. In addition, the heat treatment of the liner makes the TiN in the liner more impervious to diffusion of fluorine (which is formed as a by-product of tungsten deposition) and therefore to attack of the Ti in the liner by the fluorine. Such chemical attack can form resistive by-products which can lead to poor mechanical adhesion and electrical conductivity between the liner and the underlying aluminum. The improved diffusion barrier property of the TiN in the liner assures good electrical contact at the base of the plug by preventing attack of any of the underlying unreacted Ti in the liner.

Having thus described a particular embodiment of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto. For example, a ratio of 300Å Ti/700Å TiN for the composition of the liner 18A has been found to yield the best EM lifetime and the tightest sigma. However, the anneal by itself without additional Ti shows substantial improvement, as does a 500Å Ti/700Å TiN liner.

What is claimed is:

1. The method of forming an electromigration resistant region for an interconnection structure comprising the steps of:

a) depositing a first Ti layer;

b) depositing a first Al layer on the first layer;

c) capping the first Al layer with a first antireflective capping layer;

d) patterning the first Ti layer, the first Al layer, and the first antireflective capping layer to form a first conductive line;

e) depositing an insulating layer over the first conductive line;

f) depositing a conformal coating over the insulating layer;

g) planarizing the insulating layer using chemical and mechanical polishing CMP;

h) forming a second insulating capping layer over the conformal coating to get the second insulating layer to a predetermined thickness;

i) forming a via through a region of the insulating layer to the first conductive line;

j) depositing a first adhesion-promoting coating over the via to form a liner in the via;

k) heat treating the liner to form an electromigration resistant intermetallic region at an interface between the liner and the first conductive line;

l) depositing W over and into the via;

m) etching the deposited W to leave a W plug in the via;

n) depositing a second underlayer over the W plug;

o) depositing a second Al layer over the second underlayer;

p) capping the second Al layer with a second antireflective layer; and q) patterning the second underlayer, the second aluminum layer and the second antireflective layer to form a second conductive line.

2. The method of claim 1 wherein the Al layer includes 0.5% copper and the anti-reflective layers are formed of Ti and TiN.

3. The method of claim 1, wherein the heat treating step (j) includes annealing at greater than about 400° C.

4. The method of claim 1, wherein the insulative layer is formed of $SiO_2$.

5. The method of claim 1, wherein the intermetallic region is formed of Al and Ti.

6. The method of claim 1, wherein the intermetallic region is formed of a sintered alloy of Al and Ti.

* * * * *